(12) United States Patent
Gouin

(10) Patent No.: US 11,442,084 B2
(45) Date of Patent: Sep. 13, 2022

(54) CURRENT SENSOR CIRCUITRY

(71) Applicant: Arm Limited, Cambridge (GB)

(72) Inventor: Vincent Gouin, Mandelieu (FR)

(73) Assignee: Arm Limited, Cambridge (GB)

( * ) Notice: Subject to any disclaimer, the term of this patent is extended or adjusted under 35 U.S.C. 154(b) by 261 days.

(21) Appl. No.: 16/820,415

(22) Filed: Mar. 16, 2020

(65) Prior Publication Data

US 2021/0285990 A1    Sep. 16, 2021

(51) Int. Cl.
*G01R 19/25* (2006.01)
*G01R 27/26* (2006.01)

(52) U.S. Cl.
CPC ......... *G01R 19/2513* (2013.01); *G01R 27/26* (2013.01)

(58) Field of Classification Search
CPC ...... G01R 15/00; G01R 15/12; G01R 15/125; G01R 15/14; G01R 15/142; G01R 15/144; G01R 15/146; G01R 19/00; G01R 19/0084; G01R 19/0092; G01R 19/2513; G01R 27/00; G01R 27/02; G01R 27/14; G01R 27/16; G01R 27/26
See application file for complete search history.

(56) References Cited

U.S. PATENT DOCUMENTS

| | | | |
|---|---|---|---|
| 2017/0201251 A1* | 7/2017 | Chandrasekaran | ........................ G01R 19/0092 |
| 2018/0143227 A1 | 5/2018 | Novak et al. | |
| 2020/0088769 A1* | 3/2020 | Jin | ........................ G01R 19/10 |

OTHER PUBLICATIONS

PCT International Search Report and Written Opinion; PCT/GB2021/050616; dated Aug. 20, 2021.
PCT Partial International Search Report and Written Opinion; PCT/GB2021/050616; dated Jun. 30, 2021.
Grilo, et al.; Load Monitoring Using Distributed Voltage Sensors and Current Estimation Algorithms; IEEE Transactions on Smart Grid; vol. 5, No. 4; pp. 1920-1928; Jul. 2014. DOI: 10.1109/TSG.2014.2304011.
Yaghoobi, et al.; Current Harmonic Estimation Techniques Based on Voltage Measurements in Distribution Networks; 2018AUPEC; pp. 1-6; Nov. 27, 2018. DOI: 10.1109/AUPEC.2018.8757929.
Wattel, et al.; Continuous Line Impedance Assessment of LV Feeders using Smart Meters; 2018 ISGT-Europe; Oct. 21, 2018. DOI: 10.1109/ISGTEurope.2018.8571667.
Nijhuis, et al.; Valuation of Measurement Data for Low Voltage Network Expansion Planning; Electric Power Systems Research; vol. 151; pp. 59-67; Oct. 2017. DOI: 1016/J.EPSR.2017.05.017.
Zu, et al.; A Wide Bandwidth, On-Line Impedance Measurement Method for Power Systems, Based on PLC Techniques; 2014 ISCAS; pp. 1167-1170; Jun. 1, 2014.

(Continued)

*Primary Examiner* — Hoai-An D. Nguyen
(74) *Attorney, Agent, or Firm* — Pramudji Law Group PLLC; Ari Pramudji

(57) ABSTRACT

Various implementations described herein are directed to a device having a load circuit that consumes current. The device may include a power distribution network having impedance stimulated by the load circuit. The device may include a sensing circuit that collects voltage during operation of the load circuit and reconstructs an origin current for the load circuit based on the impedance of the power distribution network and the voltage collected during operation of the load circuit.

20 Claims, 4 Drawing Sheets

(56) References Cited

OTHER PUBLICATIONS

Liu, et al.; Comparison of System Impedance Estimating Methods; 2011 APAP; pp. 2177-2181; Oct. 16, 2011. DOI: 10.1109/APAP.2011.6180788.
Xie, et al.; Network Impedance Measurements for Three-Phase High-Voltage Power Systems; 2010 APPEEC; Mar. 28, 2010.
Pilo, et al.; Robust Distribution State Estimation for Active Networks; 43rd International UPEC; Sep. 1, 2008.

* cited by examiner

CURRENT SENSOR CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional systems, a current sensor refers to a device that detects electric current in a conductive path (e.g., a wire) and then generates a signal proportional to that current. The generated signal may be used to display a measured current in an ammeter, or the generated signal may be used to control other circuit functions. In some electronics, a series-coupled shunt is typically used to provide a resistive path for measuring electric current in-line with the conductive path or wire that allows conductive flow of current along the wire and through the series-coupled shunt. When current of a chip or power domain is measured using conventional techniques, the resistive shunt is typically confronted with some bandwidth limitations, and using a series-coupled shunt to measure current along a wire often degrades power distribution in a local supply network (e.g., with the addition of series resistance from the shunt). Thus, there exists a need to improve physical design implementation of some current sensing circuitry so as to provide for more efficient current sensing operations that reduce power degradation due to in-line series resistance.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to non-invasive current sensing schemes and techniques associated with power distribution networks in physical layout design of computing architecture. For instance, various schemes and techniques described herein provide for a system or a device having an embedded real-time and non-invasive current sensor at power domain level in full-chip or sub-part that is supplied by a power regulator (e.g., voltage and/or current regulator). In some implementations, current sensing circuitry described herein may be arranged and configured to preserve a native power distribution network (PDN) without additional components coupled in series. Also, the current sensing circuitry described herein may be configured to sense current in real-time, e.g., in the range of nanoseconds. In some instances, the current sensing circuitry described herein may be configured to measure the real-time current consumed by a load circuit, such as, e.g., a processor, a CPU, etc. Further, the current sensing schemes and techniques described herein may overcome issues and problems that are associated with conventional approaches by using a native supply PDN network without modification (e.g., without any need for additional series-coupled resistance to measure current), and thus, the current sensing schemes and techniques described herein may be configured to allow for high bandwidth and true real-time current sensing of a load.

Various implementations of current sensing schemes, techniques and circuitry will be described in detail herein with reference to FIGS. 1-4.

Figure 1:
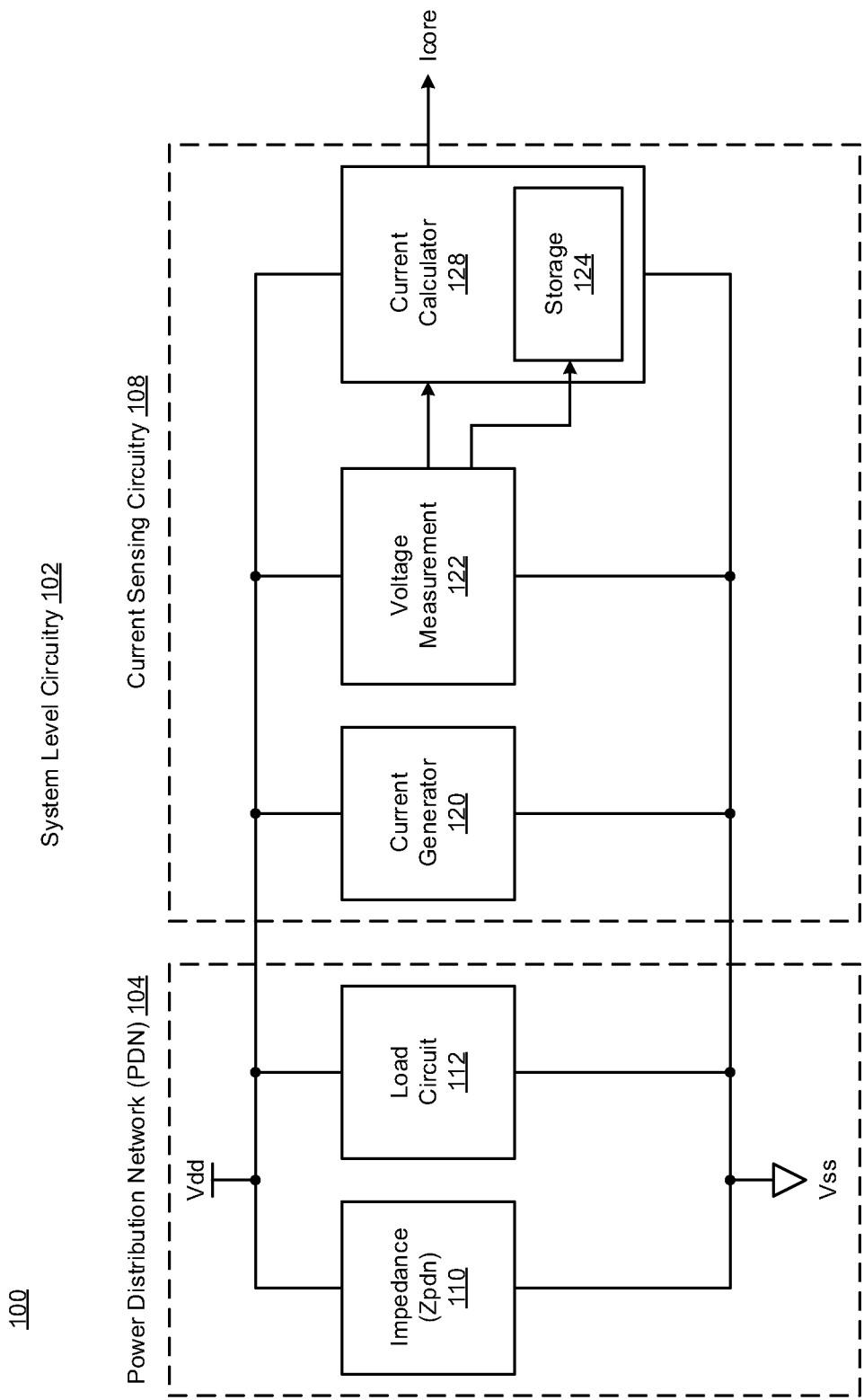
FIG. 1 illustrates system level circuitry having a current sensor in accordance with various implementations described herein.

FIG. 1 illustrates a diagram 100 of system level circuitry 102 having a power distribution network (PDN) 104 coupled to the current sensing circuitry 108 in accordance with various implementations described herein.

In various implementations, the system level circuitry 102 may be implemented as a system or device having various integrated circuit (IC) components that are arranged and coupled together as an assemblage or combination of parts that provide for a physical circuit design and related structures. In some instances, a method of designing, providing and building the system level circuitry 102 as an integrated system or device may involve use of the various IC circuit components described herein so as to thereby implement current sensing schemes and techniques associated therewith. The system level circuitry 102 may be integrated with computing circuitry and related components on a single chip, and the system level circuitry 102 may be implemented in various embedded systems for various electronic, mobile and Internet-of-things (IoT) applications.

As shown in FIG. 1, the system level circuitry 102 is associated with the power distribution network (PDN) and the current sensing circuitry 108. The power distribution network (PDN) 110 may have impedance (Zpdn) 110 stimulated by a load circuit 112 that consumes current. The current sensing circuitry 108 may be configured to characterize the impedance (Zpdn) 110 for the power distribution network (PDN) 104, collect voltage during operation of the load circuit 112, and also reconstruct an origin current for the load circuit 112 based on the impedance (Zpdn) 110 that is characterized for the PDN 104 and the voltage collected during operation of the load circuit 112.

In some implementations, the current sensing circuitry 108 may include a first circuit 120 that is coupled to the power distribution network (PDN) 104 and the load circuit 112, and the first circuit 120 may be configured to characterize the impedance (Zpdn) 110 for the PDN 104. Also, the current sensing circuitry 108 may include a second circuit 122 that is coupled to the first circuit 120, and the second circuit 122 may be configured to collect the voltage during operation of the load circuit 112. In addition, the current sensing circuitry 108 may include a third circuit 128 that is coupled to the second circuit 122, and also, the third circuit 128 may be configured to reconstruct the origin current of the load circuit 112 based on the impedance (Zpdn) 110 that is characterized for the PDN 104 and the voltage collected during operation of the load circuit 112. In some instances, the first circuit 120, the second circuit 122, and the third circuit 128 are coupled in parallel with the load circuit 112 in the power distribution network (PDN) 104.

In some instances, the first circuit 120 may be configured as a current generator that characterizes the impedance (Zpdn) 110 for the PDN 104, e.g., by generating current stimuli and sensing a transient voltage response of the PDN 104. Also, in some instances, the current generator may be configured to characterize the impedance (Zpdn) 110 of the PDN 104 by generating the current stimuli during sequential time steps and sensing the transient voltage response of the PDN 104 during the sequential time steps.

In some instances, the current sensing circuitry 108 may include storage 124, such as, e.g., a storage circuit or similar component, that is coupled to at least one of the second circuit 122 and the third circuit 128. The storage circuit 124 may be integrated as part of the third circuit 128. Also, sensing the transient voltage response of the PDN 104 may include measuring and/or storing the transient voltage response of the PDN 104 in the storage circuit 124.

In some instances, the second circuit 122 may be configured as an analog and/or digital voltage measurement circuit that collects voltage as sensed voltage during activity of the load circuit 112 by obtaining an analog and/or digital voltage measurement of the transient voltage response of the PDN 104 induced by the current stimuli. The voltage measurement circuit may be configured to collect the sensed voltage by obtaining analog and/or digital voltage measurements of the transient voltage response during sequential time steps. Also, collecting the sensed voltage during activity of the load circuit 112 may include measuring and/or storing the sensed voltage during activity of the load circuit 112 in the storage circuit 124.

In some implementations, the third circuit 128 may be configured as a current calculator that obtains current consumed by the load circuit 112 by generating a weighted sum of the current stimuli and using similar weighting factors to determine the current consumed by the load circuit 112 that caused the sensed voltage. In some instances, the current calculator may be configured to obtain (e.g., via collecting) the current consumed by the load circuit 112 at the sequential time steps by generating the weighted sum of the current stimuli during the sequential time steps.

In reference to FIG. 1, the current sensing circuitry 108 may be arranged and configured to measure the current consumed in a supply network (e.g., PDN 104) by the load circuit 112 or similar (e.g., a processor or CPU) using one or more components (e.g., 120, 122, 124, 128). For instance, in some implementations, the impedance of the PDN 104 may be characterized with the current generator 120, which generates and provides a stimulus (e.g., a current step) to the PDN 104 and then a transient voltage response of the PDN 104 may be measured by the voltage measurement circuitry 122 and/or stored in the storage circuitry 124. Also, supply voltage (Vdd) may be collected during activity of the load circuit 112 (e.g., processor or CPU) based on the voltage measurement provided by the voltage measurement circuitry 122. In various instances, the voltage measurement may refer to an analog unit or a digital unit of voltage measurement. At each time step (or current step), a magnitude of a characteristic PDN voltage response may be evaluated based on an observed voltage comprised in the magnitude, which may take the form of a coefficient. Step after step, the voltage observed may be identified as a weighted sum of the elementary characteristic voltage response. Further, the same weights applied to the characteristic current stimuli at each time step may be used to determine the current that caused the observed voltage. Using the weighted sum of the current stimuli, the current consumed by the load circuit 112 may be obtained in real-time at each timestep.

Figure 2:
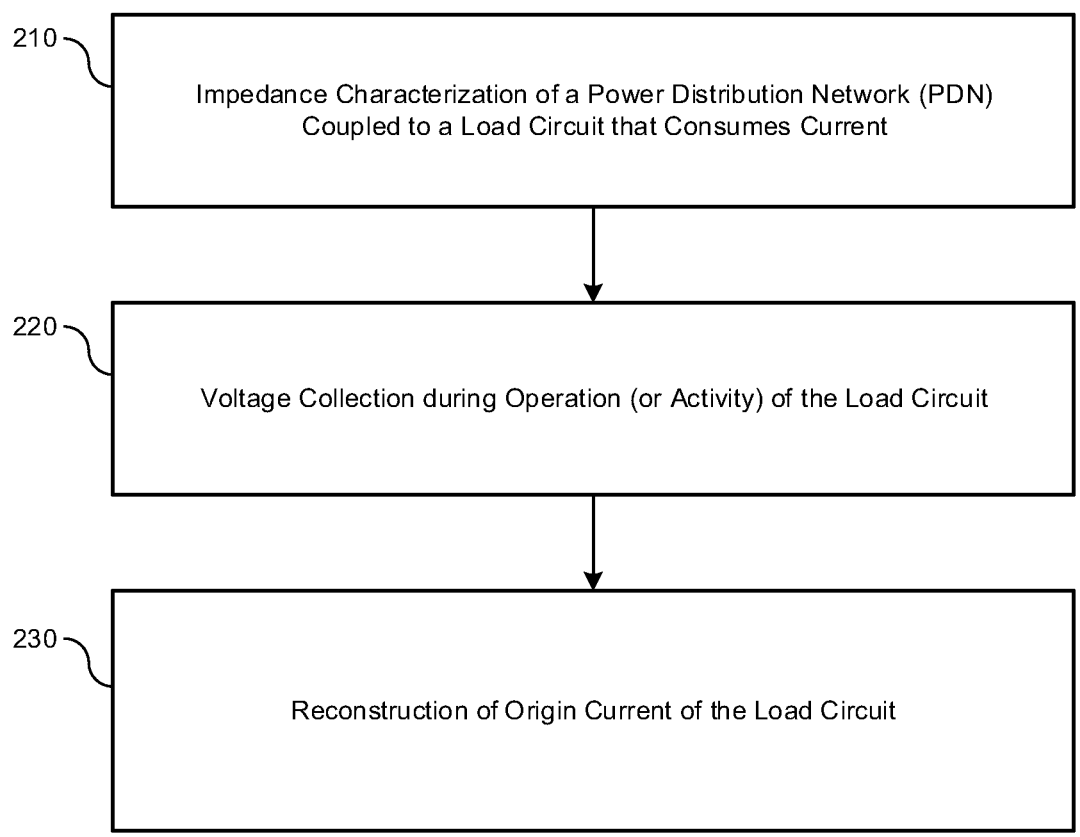
FIG. 2 illustrates a process diagram of a method for providing current sensing techniques in accordance with implementations described herein.

FIG. 2 illustrates a process flow diagram of a method 200 for providing current sensing techniques in accordance with implementations described herein.

It should be understood that even though method 200 may indicate a particular order of operation execution, in some cases, various portions of the operations may be executed in a different order, and on different systems. Additional operations and/or steps may be added to and/or omitted from method 200. Also, method 200 may be implemented in hardware and/or software. For instance, if implemented in hardware, method 200 may be implemented with various components and/or circuitry, as described herein above in reference to FIG. 1. In other instances, if implemented in software, method 200 may be implemented as programs and/or software instruction processes that are configured for various current sensing schemes and techniques described herein. Also, if implemented in software, instructions related to implementing features and aspects of method 200 may be stored in memory and/or a database. In other instances, a computer or various other types of computing devices having at least one processor and memory may be configured to perform method 200.

In some implementations, method 200 and related current sensing circuitry may be used for embedded real-time and non-invasive current sensing circuitry. For instance, various current sending schemes and techniques described herein may be implemented at power domain level (e.g., in full-chip or sub-part supplied by a regulator), and various current sending schemes and techniques described herein may be configured to preserve the native power distribution network (PDN), wherein no additional elements are needed in series, and also, current may be sensed in real-time down to the nanosecond.

In reference to FIG. 2, at block 210, method 200 may characterize impedance of a power distribution network (PDN) coupled to a load circuit that consumes current. In some instances, characterizing the impedance of the power distribution network (PDN) may include generating current stimuli and sensing a transient voltage response of the power distribution network (PDN). In addition, sensing the transient voltage response of the power distribution network (PDN) may include measuring and/or storing the transient voltage response of the power distribution network (PDN) in a storage circuit, device, or similar component. The current stimuli may be generated during sequential time steps, and also, the transient voltage response of the power distribution network (PDN) may be sensed during the sequential time steps.

At block 220, method 200 may collect voltage during operation of the load circuit. In some instances, the voltage may be collected as sensed voltage during activity of the load circuit, and collecting the voltage may include obtaining an analog and/or digital voltage measurement of the transient voltage response of the power distribution network (PDN) induced by the current stimuli during the sequential time steps.

At block 230, method 200 may reconstruct an origin current of the load circuit based on the impedance of the power distribution network (PDN) and the voltage collected during operation of the load circuit. In some instances, method 200 may be adapted and configured for real-time reconstruction of the origin current of the load circuit based on the impedance of the PDN and voltage collected during operation of the load circuit. In some instances, reconstructing the origin current may include obtaining current consumed by the load circuit by generating a weighted sum of the current stimuli and also using similar weighting factors so as to determine the current consumed by the load circuit that caused the sensed voltage. In addition, the current consumed by the load circuit may be obtained at sequential time steps (which may also be referred to as current steps) by generating a weighted sum of the current stimuli during the sequential time steps.

Figure 3:
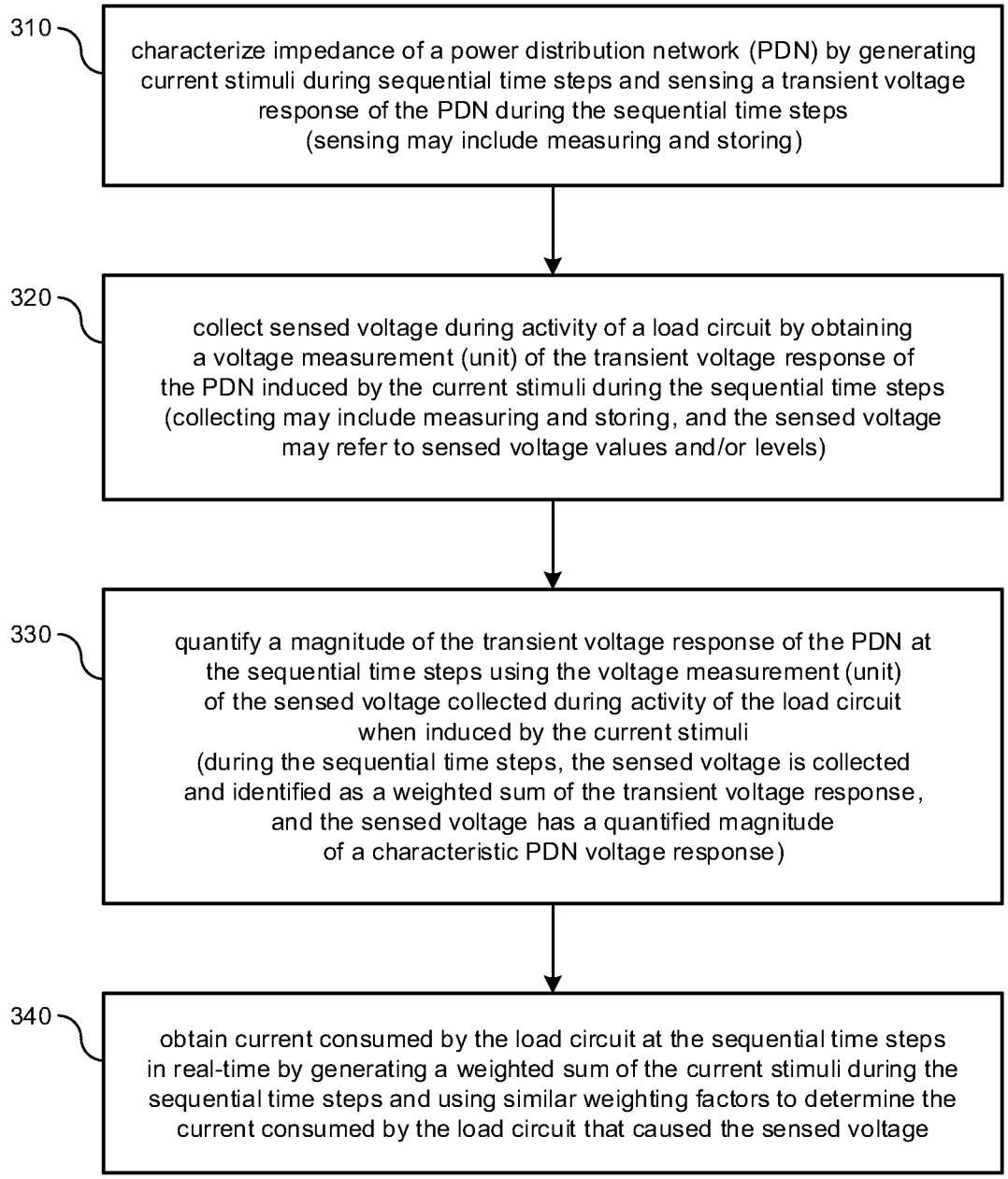
FIG. 3 illustrates a process diagram of another method for providing current sensing techniques in accordance with implementations described herein.

In some implementations, real-time current calculations may be achieved with one or more of the following equations. For instance, ic(t) may refer to the current stimulus for collection of the PDN characteristic voltage response vc(t). Also, v(t) may refer to the voltage observed during load activity with (n) samples, when current ICPU(t) is searched for. In addition, the coefficients to be calculated may be used to construct v(t) as a sum of aj*vc and iCPU(t) as a sum of aj*ic, wherein:

$a0 = v(t1)/vc(t1);$ $a1 = [v(t2) - a0*vc(t2)]/vc(t1);$ and $\ldots aj = [v(tj+1) - \text{sum}(k=0 \text{ to } j-1; ak*vc(tj+1-k))]/vc(t1); j \text{ in } [1; n-1].$ Further, $iCPU(tj) = \text{sum}(k=0 \text{ to } j; aj*ic(tj-k)); j \text{ in } [0; n-1].$ FIG. 3 illustrates a process flow diagram of another method 300 for providing current sensing techniques in accordance with implementations described herein.

It should be understood that even though method 300 may indicate a particular order of operation execution, in some cases, various portions of the operations may be executed in a different order, and on different systems. Additional operations and/or steps may be added to and/or omitted from method 300. Also, method 300 may be implemented in hardware and/or software. For instance, if implemented in hardware, method 300 may be implemented with various components and/or circuitry, as described herein above in reference to FIGS. 1-2. In other instances, if implemented in software, method 300 may be implemented as programs and/or software instruction processes that are configured for current sensing schemes and techniques described herein. Also, if implemented in software, instructions related to implementing features and aspects of method 300 may be stored in memory and/or a database. In other instances, a computer or various other types of computing devices having at least one processor and memory (e.g., as described and shown herein below in reference to FIG. 4) may be configured to perform current sensing schemes and techniques of method 300.

In some implementations, method 300 and related current sensing circuitry may be used to measure current consumed in a supply network or a power distribution network (PDN). For instance, various current sensing schemes and techniques described herein use the native supply network without any modification (e.g., without use of series coupled resistance). Also, the various current sensing schemes and techniques described herein allow for high bandwidth and real-time functionality.

In reference to FIG. 3, at block 310, method 300 may characterize impedance of a power distribution network (PDN) coupled to a load circuit that consumes current by generating current stimuli for the PDN. In some instances, method 300 may characterize the impedance of the PDN by generating current stimuli during sequential time steps and sensing a transient voltage response of the PDN during the sequential time steps (sensing may include measuring and storing). In some instances, method 300 may characterize the impedance of the power distribution network (PDN) by generating the current stimuli during sequential time steps and by sensing the transient voltage response of the PDN based on the current stimuli during the sequential time steps.

At block 320, method 300 may sense a transient voltage response of the power distribution network (PDN) based on the current stimuli. In some instances, method 300 may collect sensed voltage during activity of the load circuit by obtaining an analog and/or digital voltage measurement (unit) of the transient voltage response of the PDN induced by the current stimuli during the sequential time steps. In some instances, collecting may include measuring and/or storing, and the sensed voltage may refer to sensed voltage values and/or levels. Also, in some instances, sensing the transient voltage response of the power distribution network (PDN) may include measuring and/or storing the transient voltage response of the PDN in a storage circuit, device or similar component. In addition, method 300 may obtain (via collecting) the analog and/or digital voltage measurement of the transient voltage response of the power distribution network (PDN) induced by the current stimuli during the sequential time steps.

At block 330, method 300 may collect sensed voltage during activity of the load circuit based on the transient voltage response of the power distribution network (PDN) induced by the current stimuli. In some instances, method 300 may quantify a magnitude of the transient voltage response of the PDN at the sequential time steps using the voltage measurement (unit) of the sensed voltage collected during activity of the load circuit when induced by the current stimuli. In some instances, during the sequential time steps, the sensed voltage may be collected and identified as a weighted sum of the transient voltage response, and the sensed voltage may have a quantified magnitude of the characteristic PDN voltage response. Also, in some instances, method 300 may quantify the magnitude of the transient voltage response of the power distribution network (PDN) at the sequential time steps using the voltage measurement of the sensed voltage collected during activity of the load circuit when induced by the current stimuli.

At block 340, method 300 may quantify a magnitude of the transient voltage response of the power distribution network (PDN) using the sensed voltage collected during activity of the load circuit when induced by the current stimuli. In some instances, method 300 may obtain current consumed by the load circuit at the sequential time steps in real-time by generating a weighted sum of the current stimuli during the sequential time steps and using similar weighting factors to determine the current consumed by the load circuit that caused the sensed voltage. During sequential time steps, the sensed voltage may be collected and identified as the weighted sum of the transient voltage response, and also, the sensed voltage may have a quantified magnitude of a characteristic voltage response related to the power distribution network (PDN).

In reference to the various implementations described in FIG. 1-3, the current sensing schemes and techniques described herein may provide some advantages over conventional approaches. The current sensing schemes and techniques described herein may be associated with a power distribution network (PDN) in physical layout design of computing architecture. In some instances, the current sensing circuitry described herein may be embedded on-chip and provide for high bandwidth applications, and the various novel approaches to sensing the current consumed by a load (e.g., CPU or other circuit) may be built inside a system-on-a-chip (SoC) so as to not suffer from bandwidth limitations related to traversing a package and board parasitics.

Also, in some instances, the current sensing circuitry described herein may refer to practical and low cost techniques, wherein aspects of the present disclosure are based on using available and observable voltage from a local supply network (e.g., a PDN) that is kept intact, which may refer to a practical means for making the current sensing circuit described herein substantially low cost and highly implementable without degrading power distribution.

Further advantages may refer to time domain analysis in real-time and with low power. For instance, in some implementations, current sensing circuitry described herein may be configured to determine current by remaining in the time domain (i.e., processing data using time domain responses). Thus, the current sensing circuitry described herein provides for real-time current analysis using low power. However, in other instances, the current sensing circuitry described herein may be adapted and configured for frequency domain analysis with backward transformation to time domain. Generally, time domain analysis is highly efficient due to using less calculations, such as, e.g., approximately 20 times less calculations, and time domain analysis may determine the current at each step, which is typically not achievable using frequency domain transformations. Thus, the current sensing schemes and techniques described herein may be used to perform the time domain analysis, which provides for a drastic reduction in the number of calculations, in the form of step-by-step real-time current determinations.

Figure 4:
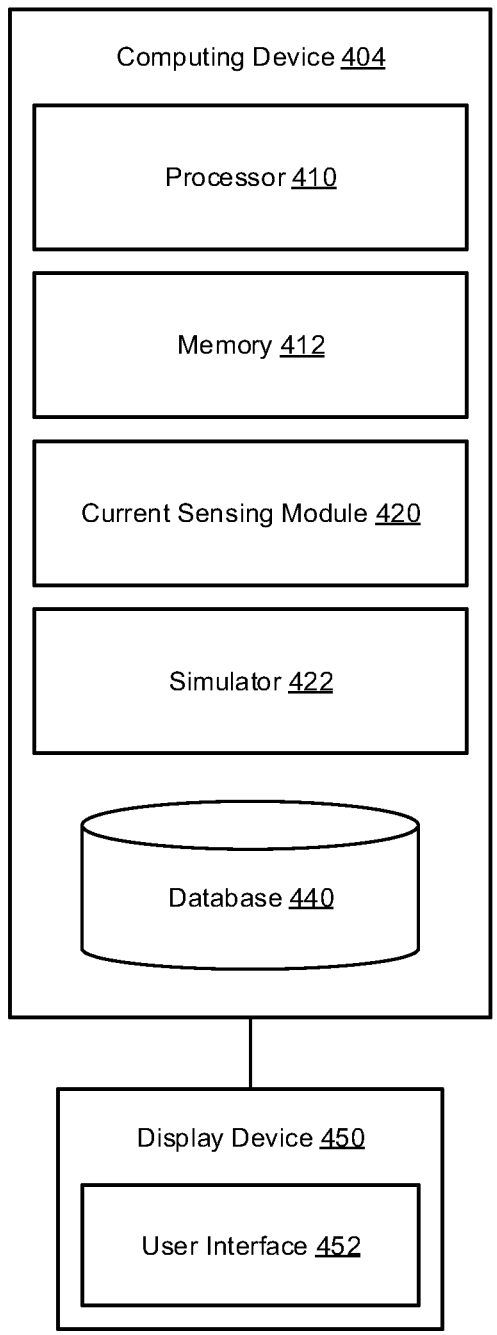
FIG. 4 illustrates a block diagram of a computer system for providing current sensing techniques in accordance with various implementations described herein.

FIG. 4 illustrates a block diagram of a computer system 400 having a current sensing module 420 along with a simulator 422 for providing current sensing techniques in accordance with various implementations described herein.

In reference to FIG. 4, the system 400 may be associated with at least one computing device 404 that is implemented as a special purpose machine configured for implementing current sensing techniques in physical layout design. In some instances, the computing device 404 may include various standard element(s) and/or component(s), including a processor 410, memory 412 (e.g., non-transitory computer-readable storage medium), one or more database(s) 440, power, peripherals, and various other computing elements and components that may not be specifically shown in FIG. 4. The computing device 404 may include instructions recorded or stored on the non-transitory computer-readable medium 412 that are executable by the processor 410. The computing device 404 may be associated with a display device 450 (e.g., monitor or other display) that may be used to provide a user with a user interface (UI) 452, such as, e.g., a graphical user interface (GUI). In some implementations, the UI or GUI 452 may be configured to receive parameters and/or preferences from a user for managing, operating, and/or controlling the computing device 404. Therefore, the computing device 404 may include the display device 450 for providing output to a user, and also, the display device 450 may include the UI 452 (or GUI) for receiving input from the user.

In reference to FIG. 4, the computing device 404 may have a current sensing module 420 that may be configured to cause the processor 410 to implement schemes and techniques described herein in reference to FIGS. 1-3, including various current sensing schemes and techniques related to the power distribution network (PDN) 104 in FIG. 1. Also, the current sensing module 420 may be implemented in hardware and/or software. In some instances, if implemented in software, the current sensing module 420 may be recorded or stored in memory 412 and/or the database 440. In some instances, if implemented in hardware, the current sensing module 420 may refer to a separate circuit or logic component that is configured to interface with the processor 410.

The current sensing module 420 may be configured to cause the processor 410 to perform various operations, as provided herein in reference to the current sensing schemes and techniques described in FIGS. 1-3. In this instance, the memory 412 has recorded or stored thereon instructions that, when executed by the processor 410, cause the processor 410 to perform one or more of the following operations.

For instance, the current sensing module 420 may be configured to cause the processor 410 to characterize impedance of a power distribution network (PDN) coupled to a load circuit that consumes current. In some instances, the current sensing module 420 may be configured to cause the processor 410 to collect voltage during operation of the load circuit. In addition, in some instances, the current sensing module 420 may be configured to cause the processor 410 to reconstruct an origin current of the load circuit based on the impedance of the power distribution network (PDN) and the voltage collected during operation of the load circuit.

In some implementations, characterizing impedance of the power distribution network (PDN) may include generating current stimuli and sensing a transient voltage response of the power distribution network (PDN), wherein sensing the transient voltage response of the power distribution network includes measuring and/or storing the transient voltage response of the power distribution network (PDN) in a storage device. In some instances, the current stimuli may be generated during sequential time steps, and also, the transient voltage response of the power distribution network (PDN) may be sensed during the sequential time steps. Also, in some instances, the voltage may be collected as sensed voltage during activity of the load circuit, and collecting the voltage may include obtaining a voltage measurement of the transient voltage response of the PDN induced by the current stimuli during sequential time steps. Also, reconstructing the origin current may include obtaining current consumed by the load circuit by generating a weighted sum of the current stimuli and also by using similar weighting factors to determine the current consumed by the load circuit that caused the sensed voltage. Also, the current consumed by the load circuit may be obtained at sequential time steps by generating the weighted sum of the current stimuli during the sequential time steps.

In accordance with various implementations described herein in reference to FIGS. 1-3, any one or more or all of these operations performed by the current sensing module 420 may be altered, modified, changed and/or updated so as to thereby provide various specific embodiments as shown in FIGS. 1-3. Also, in some instances, each of the system level components in FIG. 1 may be in a form of a physical structure having various logic features, behaviors and characteristics, and also, the physical structure may be associated with integrated circuitry that is configured to provide the various current sensing schemes and techniques described herein in reference to FIGS. 1-3.

Further, in reference to FIG. 4, the computing device 404 may include at least one simulator 422 that is configured to cause the processor 410 to generate one or more simulations of the system level circuitry 102 shown in FIG. 1. The simulator 422 may be referred to as a simulating component or module that may be implemented in hardware and/or software. If implemented in software, the simulator 422 may be recorded or stored in memory 412 or database 440. If implemented in hardware, the simulator 420 may be a separate logic circuit or processing component that is configured to interface with the processor 410. In some instances, the simulator 422 may refer to a SPICE simulator (or similar simulator) that is configured to generate SPICE simulations of the system level circuitry 102 shown in FIG. 1. SPICE refers to an acronym for Simulation Program with Integrated Circuit Emphasis, which refers to a computer-aided tool that is used as an open source analog electronic circuit simulator. Also, SPICE may refer to a general-purpose software program that is used by the semiconductor industry to check and verify integrity of physical structure designs and to predict behavior of physical structure designs. Thus, the current sensing module 420 may be configured to interface with the simulator 422 to generate various timing data based on one or more simulations (including, e.g., SPICE simulations) of physical circuit layout and related components that are used for analyzing performance characteristics of the integrated circuit including timing data of the physical circuit layout and various related components. In some instances, the current sensing module 420 may also be configured to use the one or more simulations (including, e.g., SPICE simulations) of the system level circuitry 102 shown in FIG. 1 for evaluating operating behavior and conditions thereof.

In some implementations, the computing device 404 may include one or more databases 440 configured to store and/or record various data and information related to implementing current sensing techniques in physical design. The database(s) 440 may be configured to store data and information related to system level integrated circuitry, operating conditions, operating behavior and/or timing data of a circuit layout design and related components. In some instances, the database(s) 440 may be configured to store data and information related to the circuit layout and related components and timing data in reference to simulation data (including, e.g., SPICE simulation data).

In various implementations, impedance of a power distribution network (PDN) may be characterized (or determined, or described) with various extraction tools that are configured to analyze a design database associated with a chip, a package, or a board to obtain a netlist of various circuit elements (such as, e.g., active or passive components, including resistors, capacitors, inductors, etc.). By some means, (e.g., various simulations including simulating a current source that stimulates the PDN and collecting the transient voltage, e.g., S matrix of impedance . . . ), the current sensing techniques described herein may be achieved without material stimulation of the PDN. Therefore, in some instances, the current sensing module 420 may be equipped with extraction tools (e.g., computer-aided drawing (CAD) tools) that are configured to characterize the impedance of the PDN and store related data in memory (e.g., 412, 440) to thereby perform various calculations and/or current reconstruction. Also, in some instances, the current sensing module 420 may be configured to perform calculations in real-time.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include a load circuit that consumes current. The device may include a power distribution network having impedance stimulated by the load circuit. The device may include a sensing circuit that collects voltage during operation of the load circuit and reconstructs an origin current for the load circuit based on the impedance of the power distribution network and the voltage collected during operation of the load circuit.

Described herein are various implementations of a method. The method may include characterizing impedance of a power distribution network coupled to a load circuit that consumes current. The method may include collecting voltage during operation of the load circuit. The method may include reconstructing an origin current of the load circuit based on the impedance of the power distribution network and the voltage collected during operation of the load circuit.

Described herein are various implementations of a method. The method may include generating current stimuli for a power distribution network coupled to a load circuit that consumes current. The method may include sensing a transient voltage response of the power distribution network based on the current stimuli. The method may include collecting sensed voltage during activity of the load circuit based on the transient voltage response of the power distribution network induced by the current stimuli. The method may include quantifying a magnitude of the transient voltage response of the power distribution network using the sensed voltage collected during activity of the load circuit when induced by the current stimuli.

Described herein are various implementations of a system. The system may include a processor and memory having stored thereon instructions that, when executed by the processor, cause the processor to characterize impedance of a power distribution network coupled to a load circuit that consumes current. The instructions may cause the processor to collect voltage during operation of the load circuit. The instructions may cause the processor to reconstruct an origin current of the load circuit based on the impedance of the power distribution network and the voltage collected during operation of the load circuit.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
    a load circuit that consumes current;
    a power distribution network having impedance stimulated by the load circuit; and
    a sensing circuit that collects voltage during operation of the load circuit and reconstructs an origin current for the load circuit based on the impedance of the power distribution network and the voltage collected during operation of the load circuit,
    wherein the sensing circuit comprises a first circuit that is configured as a current generator to characterize the impedance for the power distribution network by generating current stimuli and sensing a transient voltage response of the power distribution network.

2. The device of claim 1, wherein the sensing circuit comprises:
    a second circuit coupled to the first circuit, wherein the second circuit is configured to collect the voltage during operation of the load circuit; and
    a third circuit coupled to the second circuit, wherein the third circuit is configured to reconstruct the origin current of the load circuit based on the impedance characterized for the power distribution network and based on the voltage collected during operation of the load circuit,
    wherein the first circuit, the second circuit, and the third circuit are coupled in parallel with the load circuit in the power distribution network.

3. The device of claim 2, wherein the second circuit is configured as a voltage measurement circuit that collects the voltage as sensed voltage during activity of the load circuit by obtaining a voltage measurement of the transient voltage response of the power distribution network induced by the current stimuli.

4. The device of claim 1, wherein the current generator is configured to characterize the impedance for the power distribution network by generating the current stimuli during sequential time steps and sensing the transient voltage response of the power distribution network during the sequential time steps.

5. The device of claim 2, wherein the sensing circuit further comprises:
    a storage circuit coupled to at least one of the second circuit and the third circuit,
    wherein sensing the transient voltage response of the power distribution network includes measuring and/or storing the transient voltage response of the power distribution network in the storage circuit.

6. The device of claim 3, wherein the third circuit is configured as a current calculator that obtains current consumed by the load circuit by generating a weighted sum of the current stimuli and using similar weighting factors to determine the current consumed by the load circuit that caused the sensed voltage.

7. The device of claim 3, wherein the voltage measurement circuit is configured to collect the sensed voltage by obtaining the voltage measurement of the transient voltage response during sequential time steps.

8. The device of claim 3, wherein the sensing circuit further comprises:
    a storage circuit coupled to at least one the second circuit and the third circuit,
    wherein collecting the sensed voltage during activity of the load circuit includes measuring and/or storing the sensed voltage during activity of the load circuit in the storage circuit.

9. The device of claim 6, wherein the current calculator is configured to obtain the current consumed by the load circuit at sequential time steps by generating the weighted sum of the current stimuli during the sequential time steps.

10. A system, comprising:
    a processor; and
    memory having stored thereon instructions that, when executed by the processor, cause the processor to:
        characterize impedance of a power distribution network coupled to a load circuit that consumes current;
        collect voltage during operation of the load circuit; and
        reconstruct an origin current of the load circuit based on the impedance of the power distribution network and the voltage collected during operation of the load circuit,
    wherein characterizing the impedance of the power distribution network includes generating current stimuli and sensing a transient voltage response of the power distribution network.

11. A method, comprising:
    characterizing impedance of a power distribution network coupled to a load circuit that consumes current;
    collecting voltage during operation of the load circuit; and reconstructing an origin current of the load circuit based on the impedance of the power distribution network and the voltage collected during operation of the load circuit,
wherein characterizing the impedance of the power distribution network includes generating current stimuli and sensing a transient voltage response of the power distribution network.

12. The method of claim 11, wherein sensing the transient voltage response of the power distribution network includes measuring and/or storing the transient voltage response of the power distribution network in a storage device.

13. The method of claim 11, wherein the current stimuli is generated during sequential time steps, and wherein the transient voltage response of the power distribution network is sensed during the sequential time steps.

14. The method of claim 12, wherein the voltage is collected as sensed voltage during activity of the load circuit, and wherein collecting the voltage includes obtaining a voltage measurement of the transient voltage response of the power distribution network induced by the current stimuli during sequential time steps.

15. The method of claim 14, wherein reconstructing the origin current includes obtaining current consumed by the load circuit by generating a weighted sum of the current stimuli and using similar weighting factors to determine the current consumed by the load circuit that caused the sensed voltage.

16. The method of claim 15, wherein the current consumed by the load circuit is obtained at sequential time steps by generating the weighted sum of the current stimuli during the sequential time steps.

17. A method, comprising:
generating current stimuli for a power distribution network coupled to a load circuit that consumes current;
sensing a transient voltage response of the power distribution network based on the current stimuli;
collecting sensed voltage during activity of the load circuit based on the transient voltage response of the power distribution network induced by the current stimuli; and
quantifying a magnitude of the transient voltage response of the power distribution network using the sensed voltage collected during activity of the load circuit when induced by the current stimuli.

18. The method of claim 17, wherein sensing the transient voltage response of the power distribution network includes measuring and/or storing the transient voltage response of the power distribution network in a storage device.

19. The method of claim 17, further comprising:
obtaining current consumed by the load circuit by generating a weighted sum of the current stimuli and using similar weighting factors to determine the current consumed by the load circuit that caused the sensed voltage,
wherein during sequential time steps, the sensed voltage is collected and identified as the weighted sum of the transient voltage response, and
wherein the sensed voltage has a quantified magnitude of a characteristic voltage response related to the power distribution network.

20. The method of claim 17, further comprising:
characterizing impedance of the power distribution network by generating the current stimuli during sequential time steps and sensing the transient voltage response of the power distribution network based on the current stimuli during the sequential time steps;
obtaining a voltage measurement of the transient voltage response of the power distribution network induced by the current stimuli during the sequential time steps; and
quantifying the magnitude of the transient voltage response of the power distribution network at the sequential time steps using the voltage measurement of the sensed voltage collected during activity of the load circuit when induced by the current stimuli.

\* \* \* \* \*